United States Patent [19]

Suzuki et al.

[11] Patent Number: 5,764,580

[45] Date of Patent: Jun. 9, 1998

[54] SEMICONDUCTOR INTEGRATED CIRCUIT

[75] Inventors: Yukihide Suzuki; Tsugio Takahashi. both of Tokyo; Shunichi Sukegawa, Ibaraki; Koichi Abe, Tokyo, all of Japan

[73] Assignees: Hitachi, Ltd., Tokyo, Japan; Texas Instruments Incorporated, Dallas, Tex.

[21] Appl. No.: 689,921

[22] Filed: Aug. 16, 1996

[30] Foreign Application Priority Data

Aug. 18, 1995 [JP] Japan ..................................... 7-233390

[51] Int. Cl.⁶ .............................................. G11C 7/00
[52] U.S. Cl. .................................. 365/205; 365/189.05
[58] Field of Search ...................... 327/52; 365/189.05, 365/205, 207, 208

[56] References Cited

U.S. PATENT DOCUMENTS

| | | | |
|---|---|---|---|
| 4,980,799 | 12/1990 | Tobita | 365/182 |
| 5,402,042 | 3/1995 | Madsen | 315/174 |
| 5,457,421 | 10/1995 | Tanabe | 327/530 |
| 5,546,026 | 8/1996 | Lin et al. | 327/52 |
| 5,576,644 | 11/1996 | Pelella | 327/52 |

FOREIGN PATENT DOCUMENTS

| | | |
|---|---|---|
| A-4-281291 | 10/1992 | Japan . |
| A-5-62467 | 3/1993 | Japan . |
| A-5-135579 | 6/1993 | Japan . |

OTHER PUBLICATIONS

Nakamura et al., "FA14.2: A 29ns 64Mb DRAM with Hierarchical Array Architecture", 1995 IEEE Int'l Solid-State Circuits Conference.

*Primary Examiner*—David C. Nelms
*Assistant Examiner*—Michael T. Tran
*Attorney, Agent, or Firm*—Antonelli, Terry, Stout & Kraus, LLP

[57] ABSTRACT

A semiconductor integrated circuit capable of preventing the excessive overdriving of sense amplifiers when the supply voltage fed thereto is raised. The integrated circuit has differential amplifiers for amplifying a potential difference on complementary signal lines, and a control circuit for generating a first driving control signal for supplying the differential amplifiers with a first driving voltage as an overdriving power supply therefor. The control circuit further generates a second driving control signal for supplying the differential amplifiers with a second driving voltage which is activated after the activated first driving control signal is deactivated and which is lower in level than the first driving voltage. The control circuit includes a MOS circuit as a delay circuit composed of MOS transistors for defining a time interval from the time the first driving control signal is activated until the second driving control signal is activated. With this arrangement, the period during which the overdriving voltage is applied is variable in dependence on the level of the supply voltage such that the overdrive period is relatively short if the supply voltage is high and relatively long if the supply voltage is low.

24 Claims, 6 Drawing Sheets

SEMICONDUCTOR INTEGRATED CIRCUIT

BACKGROUND OF THE INVENTION

The present invention relates to a semiconductor integrated circuit incorporating overdriven differential amplifiers and, more particularly,to a dynamic random access memory (DRAM) whose operating voltage is held low due to its high degree of integration.

Recently, the storage capacity of DRAMs has been enhanced by downsizing their MOS transistor components such as memory cell transistors. The smaller MOS transistors necessitate shorter gate lengths requiring thinner gate oxidation layers. These requirements are correspondingly prompting in reduction of the operating voltage of the memory. DRAMs, in particular, perform high-level write operations (i.e., charging of memory cell capacitances) while maintaining their efficiency in high-level read performance (or relatively increasing the margin of high-level read operations) in one of two ways: by raising the level at which to select word lines, or by lowering the voltage of data lines to which data I/O terminals of memory cells are connected (i.e., lowering the level to be reached by the data lines through amplifying operations of the sense amplifiers). Given their higher degrees of integration, however, the MOS transistors have gate oxidation films so thin that they are vulnerable to destruction if the voltage level of word lines is arbitrarily raised. The reliability of the DRAM would suffer as a result. What is required here is the lowering of the voltage on data lines. But the lowering of the voltage on the data lines prevents the sense amplifiers from operating at high speed. With the voltage of the operating power supplies for the sense amplifiers reduced, the sense amplifiers have less current flowing therethrough. When memory cell-charged information is read out onto a data line, the reduced current flowing through the corresponding sense amplifiers lowers the speed of amplifying the small potential difference with respect to the complementary data line.

One conventional way to operate sense amplifiers at high speed on a low voltage is the so-called overdrive technique. Where sense amplifiers are configured into a CMOS static latch setup, a given sense amplifier is operated by having the source of its p-channel MOS transistor fed with an externally supplied voltage VDD at the outset of a sense amplifier activation timing, and then fed with a voltage VDL acquired by reducing the externally supplied voltage VDD. An example of such an overdrive technique applicable to sense amplifiers is disclosed in the ISSCC 95. "A 29 ns 64 Mb DRAM with Hierarchical Array Architecture/FA 14.2."

The inventors of the present invention studied the disclosed overdrive technique of the ISSCC 95 document and found the following disadvantage. In the ISSCC 95 arrangement, the source of the p-channel MOS transistor which is part of each sense amplifier is fed with the externally supplied voltage VDD via a switching element, and that source is connected via another switching element to the output terminal of a step-down circuit. The lines that feed both the externally supplied voltage VDD and the stepped-down voltage VDL are shared by numerous sense amplifiers. When a sense amplifier is given the externally supplied voltage VDD, it operates at high speed because the supplied voltage VDD is higher than the stepped-down voltage VDL. That is, the initial transient response in the amplifying operation of the sense amplifier is accelerated. Then the operating power supply for the sense amplifier switches to the stepped-down voltage VDL. At the time of the switching operation, a current can flow in reverse from the sense amplifier to the output terminal of the step-down circuit. The reverse current flow can occur when the externally supplied voltage VDD is in excess of its highest tolerable level or when it is fed at a higher level than usual. This can occur, for example, when testing the margin of operations where the data lines and the line feeding the operating power supply, which line is shared by the many sense amplifiers, includes undesirable capacitances.

The setup above adopts as its step-down circuit a circuit arrangement having a high resistance serially connected to a current source coupled to the externally supplied voltage in an attempt to minimize the feedthrough current in the step-down circuit. However, as the inventors found, the current flowing in reverse from the sense amplifier side to the output terminal of the step-down circuit is prevented by the high resistance from rapidly leaking to the ground potential. As a result, the stepped-down voltage VDL can be undesirably raised.

The inadvertent rise in the stepped-down voltage VDL leads to undesirably raising the voltage level to be reached by the data lines through the amplifying operation of the sense amplifiers. This reduces the difference in potential between the word line selection level and the high level of the data lines, with the result that upon a high-level write signal to a memory cell, the high-level voltage of the data line cannot be applied to the memory cell capacitance. If the undesirable rise in the stepped-down voltage level pushes up the voltage level to be reached by the data lines, there also occurs an increase in the initial level (i.e., pre-charge level) of the data lines to be equalized while the chip remains unselected. If the data written in such a state is read out, the high-level read voltage margin with respect to the pre-charge level is reduced. Furthermore, if the step-up circuit for forming the word line selection level utilizes the stepped-down voltage VDL, the unwanted rise in the stepped-down voltage VDL increases the word line selection level, raising the possibility of destroying the gate oxidation films of the memory cell selection transistors.

Another example of an overdrive technique applicable to overdriving sense amplifiers is shown in Japanese Laid-Open Application No. JP-A-5-62467. In this arrangement, a delay circuit is provided to generate a variable delay for controlling the relative amounts of time the overdrive operation is provided compared with the time the low voltage drive is provided. Specifically, this delay is generated using a dummy cell array, including dummy data lines, to simulate the capacitance of the data lines in the actual memory cell array. Although this dummy cell arrangement provides a variable overdrive depending on the simulated capacitance of the memory array, the inventors of the present invention have discovered, through their investigation, that it has certain significant drawbacks. For one thing, the dummy arrangement requires a great deal of space, which is, of course, undesirable in a semiconductor memory device. Also, the complexity of the circuitry is increased by the need for a comparator in the arrangement taught in JP-A-5-62467. Further, the dummy data lines are at the end of the device, causing a stepped portion. This complicates the manufacturing, processes of that memory device and can lead to malfunctions if the dummy data lines are not properly formed.

SUMMARY OF THE INVENTION

It is, therefore, an object of the present invention to provide a semiconductor integrated circuit capable of preventing the excessive overdriving of differential amplifiers such as sense amplifiers when their high-potential side driving voltage is raised. Another object of the invention is to provide a semiconductor integrated circuit which, delays the undesirable rise in the stepped-down voltage of the step-down circuit feeding its voltage as an operating power supply to overdriven differential amplifiers such as sense amplifiers.

In carrying out the invention and according to one aspect thereof, there is provided a semiconductor integrated circuit comprising differential amplifiers 3 (see FIG. 1) and a control circuit TG. The differential amplifiers 3 are included in the circuitry driven at a low voltage in the semiconductor integrated circuit with its operating voltage level lowered because of its enhanced degree of transistor integration. A high-speed operation of the differential amplifiers 3 is guaranteed by a control circuit for overdrive operation. The control circuit TG generates a first driving control signal 100 SA1B for supplying the differential amplifiers 3 with a first driving voltage VDD as an operating power supply therefor. The control circuit TG further generates a second driving control signal φSA2B for supplying the differential amplifiers 3 with a second driving voltage VDL which is activated after the activated first driving control signal φSA1B is deactivated and which is lower in level than the first driving voltage VDD. In this arrangement, the control circuit TG includes a MOS circuit INV0-INVi as delay means 12 composed of MOS transistors for defining a time interval (i.e., overdrive time) from the time the first driving control signal is activated until the second driving control signal is activated.

In one preferred structure according to the invention, the MOS circuit may be simply structured by use of a CMOS inverter circuit or a MOS gate circuit.

In another preferred structure according to the invention, the delaying means 12 may comprise, in addition to the MOS circuit INV0–INV2, delay elements 25 made up of passive elements independent of a supply voltage in determining a delay time (e.g., see FIG. 3).

The overdrive technique outlined above may be applied to differential amplifiers such as the numerous sense amplifiers included in a DRAM having dynamic memory cells. The technique is intended to guarantee high-speed performance of differential amplifiers such as sense amplifiers at a time when the rising degree of integration in the memory array is accompanied by a decrease in its operating voltage. For example, in the embodiment shown in FIG. 1, the operating voltage for the memory array is the stepped-down voltage VDL acquired by a step-down circuit 1 stepping down the externally supplied voltage VDD. Where the differential amplifiers are driven, the externally supplied voltage is used as the first driving voltage, and the stepped-down voltage as the second driving voltage.

In summary, with the overdrive technique adopted as the method for driving differential amplifiers such as sense amplifiers, the externally supplied voltage may become in excess of its highest tolerable level or may be made higher than usual for testing the margin of operation. In such a case, a switch of the operating power supply of the differential amplifiers from the externally supplied voltage VDD to the stepped-down voltage VDL can trigger a reverse current flow from the differential amplifier side to the output terminal of the step-down circuit. Illustratively, the step-down circuit may be one in which a high resistance is serially connected to the current source coupled to the supply voltage in order to minimize the feedthrough current inside.

With such a step-down circuit in place, the current flowing in reverse from the sense amplifier side toward the output terminal of the step-down circuit is prevented by the high resistance from quickly leaking to ground potential. This is where the improvement of the present invention serves advantageously. In the inventive semiconductor integrated circuit, the higher the operating supply voltage for the MOS circuit such as the MOS inverter defining the overdrive, the shorter the transient response time thereof. This means a relatively prolonged overdrive time being selected when the externally supplied voltage VDD is low, and a relatively short overdrive time when the externally supplied voltage VDD is high. When the delay circuit is negatively dependent for its delay time on the externally supplied voltage VDD, the differential amplifiers are protected from becoming excessively overdriven.

With the differential amplifier circuitry thus protected from excess overdrive, it is possible to prevent the reverse current flow from the numerous differential amplifiers such as sense amplifiers, toward the step-down circuit. This, in turn, prevents the stepped-down voltage from becoming inadvertently raised.

These and other objects, features and advantages of the invention will become more apparent upon a reading of the following description and appended drawings.

DESCRIPTION OF THE PREFERRED EMBODIMENTS

Figure 4:
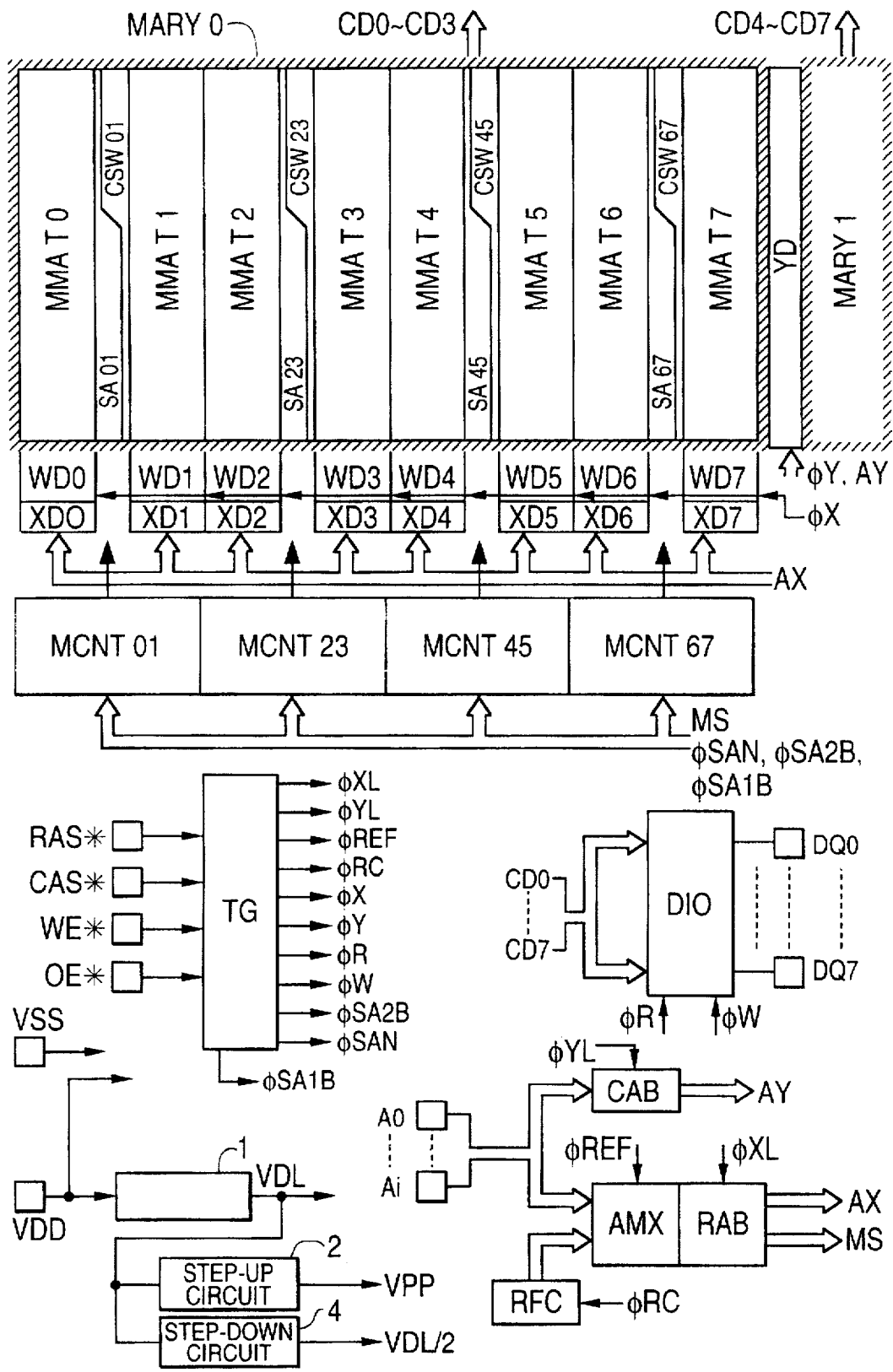
FIG. 4 is an overall block diagram of a DRAM embodying the invention.

FIG. 4 is an overall block diagram of a DRAM embodying the invention. The illustrated DRAM is formed, by way of illustration by known technology for semiconductor integrated circuit fabrication on a single semiconductor substrate typically made of single crystal silicon. FIG. 4 depicts two typical memory arrays MARY0 and MARY1.

The DRAM embodying the invention receives through its external power terminals an externally supplied voltage VDD (e.g., 3.3 V) and a ground potential VSS (e.g., 0 V). This DRAM has its storage capacity enhanced by downsizing MOS transistors constituting the memory arrays MARY0 and MARY1. With the gate lengths of the MOS transistors thus reduced, their gate oxidation films are made thinner correspondingly. This necessitates getting the memory arrays MARY0 and MARY1 to operate on a stepped-down voltage VDL of, say, 2.2 V as their basic operating power supply. The stepped-down voltage VDL is generated by a step-down circuit 1 stepping down the externally supplied voltage VDD.

The memory arrays MARY0 and MARY1 are each divided into eight memory mats MMAT0 to MMAT7. The memory mats MMAT0 through MMAT7 each comprise numerous single-transistor dynamic memory cells each, in turn, having its selection terminal connected to a word line and its data I/O terminal coupled to a complementary data line. Each memory mat is furnished with word drivers WD0 through WD7 and row address decoders XD0 through XD7. When any of the row address decoders XD0 to XD7 is selected for operation, the selected decoder decodes an internal complementary row address signal AX to generate a word line selection signal while selecting a single word line corresponding to the internal complementary row address signal AX. Upon receipt of the word line selection signal, the word drivers WD0 through WD7 drive the applicable word line to a selection level in synchronism with a word line driving timing designated by a control signal φX. The word line selection level generated by the word drivers WD0 through WD7 is a stepped-down voltage VPP higher than the stepped-down voltage VDL. The stepped-up voltage VPP is generated by a step-up circuit 2 stepping up the stepped-down voltage VDL.

Reference characters SA01, SA23, SA45 and SA67 in FIG. 4 represent sense amplifier blocks, and CSW01, CSW23, CSW45 and CSW 67 are column switching circuit blocks. The sense amplifier blocks and column switching circuit blocks are each located between a pair of right- and left-hand memory mats. That is, one sense amplifier and one column switching circuit block are shared by the two adjacent memory mats. The memory mats flanking each of the sense amplifier blocks SA01, SA23, SA45 and SA67 as well as the column switching circuit blocks CSW01, CSW23, CSW45 and CSW67 adopt what is known as the shared data line structure whereby one of the paired memory mats is selected for operation. Mat controllers MCNT01, MCNT23, MCNT45 and MCNT 67, each serving one pair of memory mats, control memory mat selection and operation, including control over the individual sense amplifier blocks and a data line sharing switching circuit (see FIG. 5) between the memory mats sharing the sense amplifier blocks.

The mat controllers MCNT01, MCNT23, MCNT45 and MCNT67 are fed with a mat selection signal MS and sense amplifier control signals φSAN, φSA2B and φSA1B. The mat selection signal MS is a three-bit signal designating which one of the eight memory mats MMAT0 to MMAT7 is to be selected. In practice, the mat selection signal MS corresponds to the high-order three-bit data in the row address signal held in a row address buffer RAB. The mat controllers MCNT01, MCNT23, MCNT45 and MCNT67 each decode the mat selection signal MS to control sense amplifier block operation and row address decoder activation, thereby operating the designated memory mat. For example, if the mat selection signal MS designates the memory mat MMAT0, the row address decoder XD0 is activated and the sense amplifier block SA01 is connected to the memory matt MMAT0 via the data line sharing switching circuit. This allows memory cells to be selected in the memory mat MMAT0. The sense amplifier control signals φSAN, φSA2B and φSA1B will be described later in more detail.

Each column switching circuit block CSWn receives a column selection signal from a column address decoder YD. The column selection signal causes the column switching circuit block CSWn to select four sets of complementary data lines from within the memory mat for connection to complementary common data lines CD0 through CD3. For a read operation, the column address decoder YD is made operable by a timing signal φY enabled after the word line selection operation has been completed. Thus activated, the column address decoder YD decodes an internal complementary column address signal AY to generate a column selection signal.

The operations for selecting the word line and the column allow the complementary common data lines CD0 through CD3 to conduct to the four memory cells designated by the mat selection signal MS, by the internal complementary row address signal AX and by the internal complementary column address signal AY. The memory array MARY1 is similarly constructed (not shown), with complementary common data lines CD4 through CD7 furnished on its side.

The complementary common data lines CD0 through CD7 are coupled illustratively to a data I/O circuit DIO. The data I/O circuit DIO, comprising main amplifiers, write amplifiers and data I/O buffers, performs a data input operation when a timing signal φw is enabled for a write operation, and carries out a data output operation when a timing signal φR is enabled for a read operation. The dynamic RAM as embodied herein performs data writes and reads in units of eight bits, with the low-order four bits covered by the memory array MARY0 and the high-order four bits served by the memory array MARY1.

The row address buffer RAB receives a row address signal from external address input terminals A0 through Ai via an address multiplexer AMX and holds the received signal. The address receiving operation by the buffer is timed by the high level of a timing signal φXL supplied from a timing generator (controller) TG.

With the dynamic RAM in normal operation mode, the address multiplexer AMX illustratively receives a disable-level timing signal φREF from the timing generator TG to forward the row address signal from the external terminals A0 through Ai to the row address buffer RAB. With the dynamic RAM in a CBR (CAS before RAS) refresh cycle, enabling the timing signal φREF causes a refresh address signal from a refresh address counter RFC to be selected. The selected refresh address signal is transmitted to the row address buffer RAB.

With the dynamic RAM in CBR refresh mode, the refresh address counter RFC illustratively generates a refresh address through a counting operation in synchronism with a timing signal φRC supplied at intervals of predetermined cycles from the timing generator TG.

The column address buffer CAB holds the column address signal received from the external address input terminals A0 through Ai in synchronism with the enabling of a control signal φYL coming from the timing generator TG.

The timing generator TG is fed with a row address strobe signal RAS* (the asterisked signal name indicates a low level enable signal hereunder), a column address strobe signal CAS*, a write enable signal WE* and an output enable signal OE* as external access control signals. The levels and the change timings of these supplied control signals allow the timing generator TG to determine the operation mode of the dynamic RAM and to control its internal operations by generating the above-mentioned various timing signals. When driven Low, the row address strobe signal RAS* designates selection of the chip and reports that the row address signal is effective. In response, the timing controller TG receives the row address signal and generates the above control signals successively for word line and memory mat selection. The column address strobe signal CAS* is a signal reporting that the column address signal is effective. Enabling the column address strobe signal CAS* causes the timing generator TG to receive the column address signal and to generate the above control signals successively for column selection. The write enable signal WE* when enabled orders the DRAM to perform a write operation, and enabling the output enable signal OE* orders the DRAM to carry out a read operation. The CBR refresh mode is designated when the column address strobe CAS* is enabled before the row address strobe signal RAS* is enabled.

Figure 5:
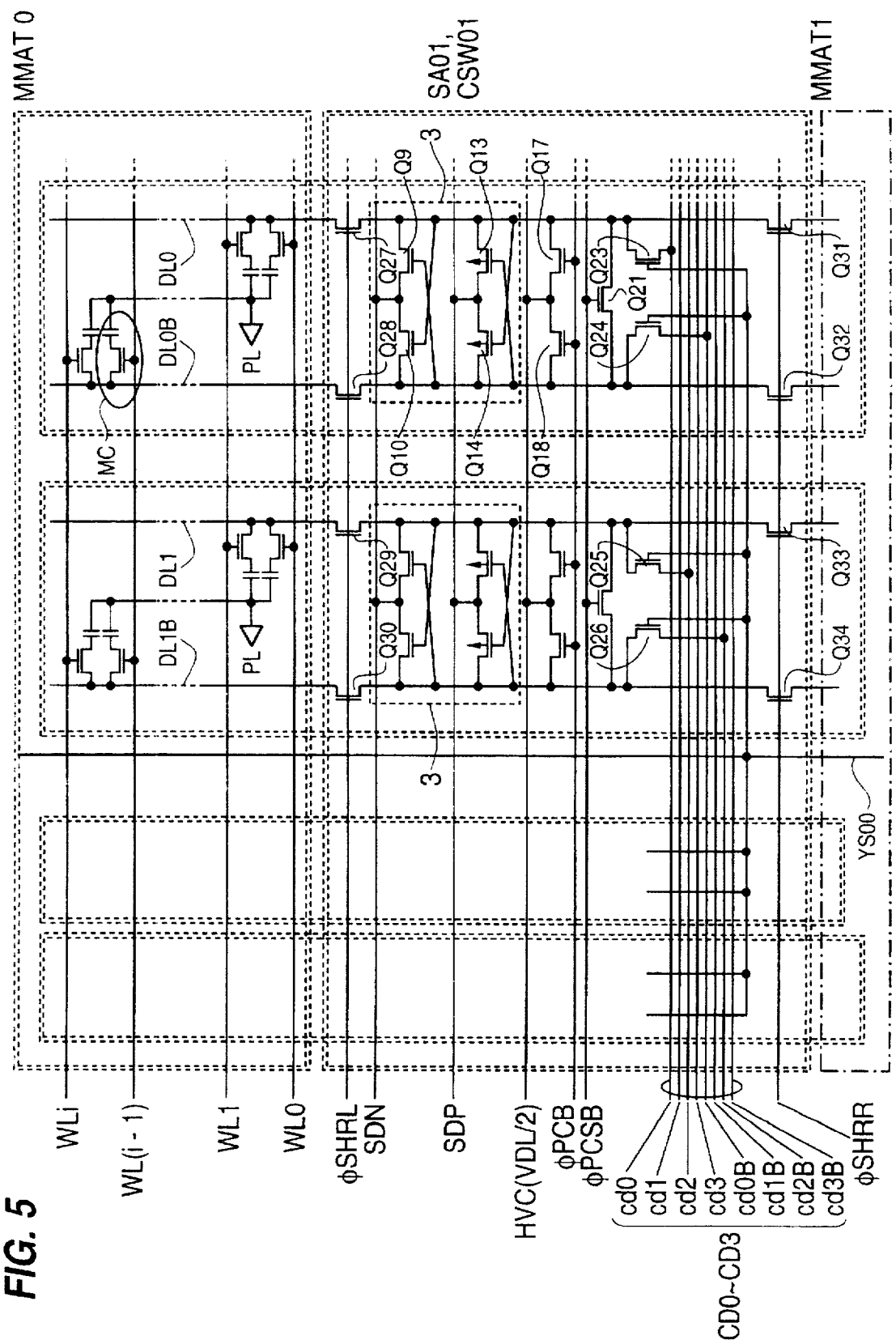
FIG. 5 is a partial circuit diagram of the inventive DRAM including memory mats, a sense amplifier block and a column switching circuit block.

FIG. 5 is a partial circuit diagram of the inventive DRAM including the memory mats MMAT0 and MMAT1, sense amplifier block SA01 and column switching circuit block CSW01. In particular, FIG. 5 highlights the circuit portion for receiving a single column selection signal YS00. In FIG. 5, the MOS transistors with their channels (back gates) showing an arrow are p-channel MOS transistors as opposed to those n-channel MOS transistors with their channels not showing an arrow. Reference characters WL0 through WLi in FIG. 5 represent word lines; DL0, DL0B, DL1 and DL1B denote complementary data lines; and MC stands for dynamic memory cells. Each dynamic memory cell MC comprises a selector MOS transistor Q1 connected to a data line and a storage capacitor SC, the transistor being connected serially to the capacitor to constitute a series circuit which in turn is connected to a plate potential PL (VDL/2). Reference characters Q27 through Q34 are some of the sharing switching MOS transistors making up the data line sharing switching circuit. The sharing switching MOS transistors Q27 through Q30 shown representively for attachment to the memory mat MMAT0 are switched by a control signal $\phi$SHRL; the sharing switching MOS transistors Q31 through Q34 indicated typically for attachment to the memory mat MMAT1 are switched by a control signal $\phi$SHRR. For example, when the mat selection signal MS selects the memory mat MMAT0, the mat controller MCNT01 brings the control signal $\phi$SHRL High; when the mat selection signal MS selects the memory mat MMAT1, the mat controller MCNT01 drives the control signal $\phi$SHRR High. The sharing switching MOS transistors associated with the memory mats not selected by the mat selection signal MS are kept off by the mat controllers corresponding to these memory mats.

N-channel MOS transistors Q9 and Q10 and p-channel MOS transistors Q13 and Q14 constitute a static latch type differential amplifier which is a sense amplifier 3. The sense amplifier 3 is provided to each complementary data line. The power to operate the sense amplifier 3 is supplied via drive lines SDN and SDP. The drive lines SDN and SDP are common to all sense amplifiers 3. How the drive lines SDN and SDP are fed with the operating power will be described later. In addition to the sense amplifier 3, each complementary data line is furnished with an MOS transistor Q21 that equalizes the complementary data line in question while the dynamic RAM is in a wait state. The MOS transistor Q21 is switched by a control signal $\phi$PCSB. Furthermore, each complementary data line is provided with MOS transistors Q17 and Q18 for supplying a pre-charge potential VDL/2 to the complementary data line in question at the same time that it is equalized. The pre-charge potential VDL/2 is half the stepped-down voltage VDL and is fed via wiring HVC. The MOS transistors Q17 and Q18 are switched by a control signal $\phi$PCB. The control signals $\phi$PCB and $\phi$PCSB are output by the timing generator TG. The pre-charge voltage VDL/2 is generated by a pre-charge voltage generator 4 (see FIG. 4) which is illustratively composed of a resistance potential divider receiving the stepped-down voltage VDL and stepping the voltage down further to VDL/2.

In FIG. 5, transistors Q23 and Q24 are column switches furnished between the complementary data lines DL0 and DL0 on the one hand, and the complementary common data line CD0 (cd0, cd0B) on the other, whereas transistors Q25 and Q26 are column switches provided between the complementary data lines DL1 and DL1B on the one hand, and the complementary common data line CD1 (cd1, cd1B) on the other. Similar column switches are attached to the respective complementary data lines. Four pairs of complementary data lines are commonly connected as one set to four pairs of complementary common data lines CD0 (cd0, cd0B), CD1 (cd1, cd1B), CD2 (cd2, cd2B) and CD3 (cd3, cd3B).

The circuit arrangement to supply the operating power to the drive lines SDN and SDP of the sense amplifiers 3 in accordance with the present invention will now be described.

Figure 1:
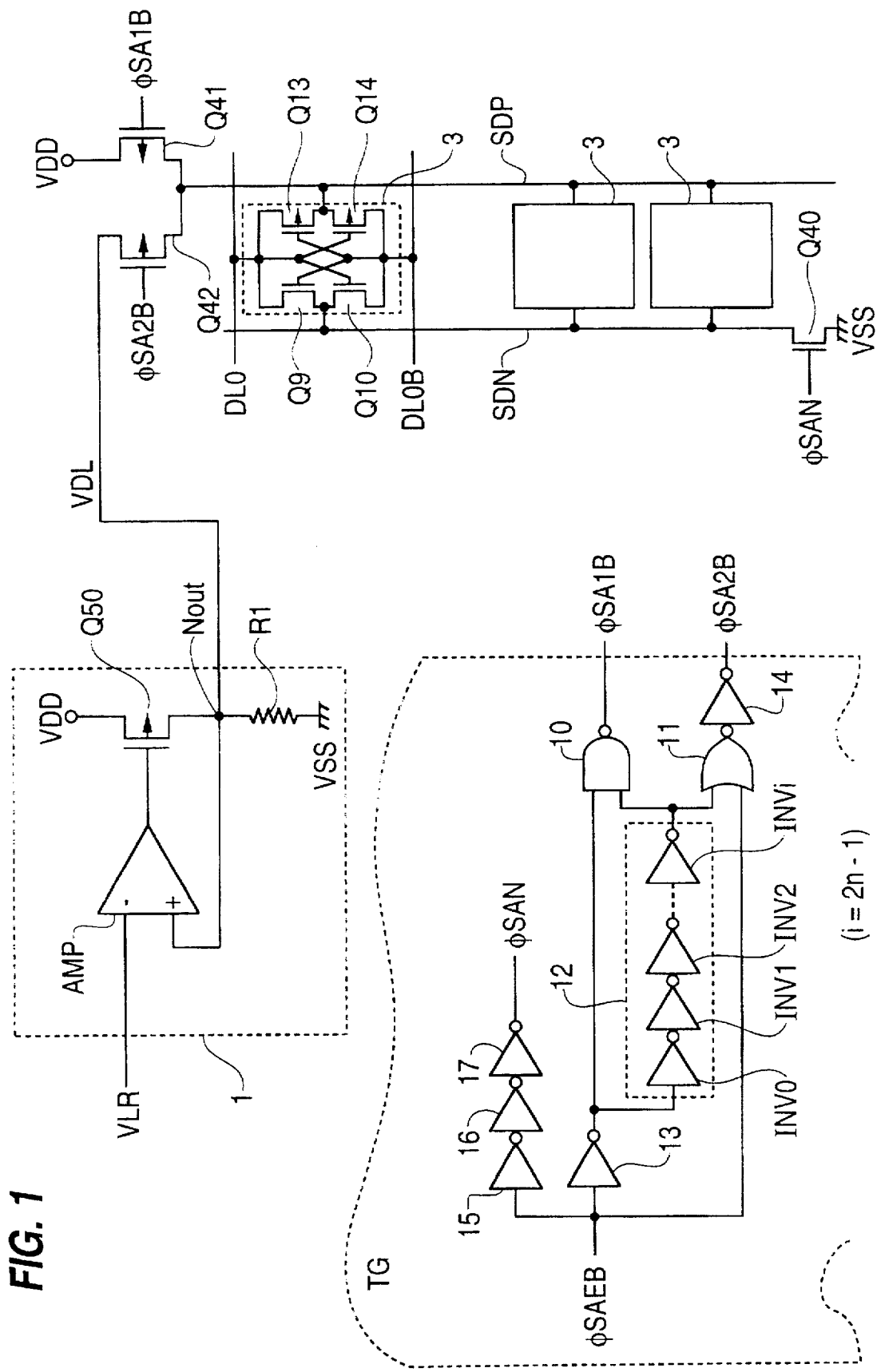
FIG. 1 is a schematic circuit diagram of a semiconductor integrated circuit controlling its sense amplifiers in an overdrive setup according to the invention.

FIG. 1 shows a circuit for supplying the operating power to the drive lines SDN and SDP of the sense amplifiers 3. While FIG. 1 indicates only one column of sense amplifiers 3, the drive lines SDN and SDP illustratively shown therein generically represent all drive lines SDN and SDP for all sense amplifiers 3 included in the DRAM of the invention. The drive line SDN is supplied with the ground potential VSS via an n-channel MOS transistor Q40 switched by the control signal $\phi$SAN. The drive line SDP is fed with the externally supplied voltage VDD via a p-channel MOS transistor Q41 switched by the control signal $\phi$SA1B. The drive line SDP is also fed with the stepped-down voltage VDL via a p-channel MOS transistor Q42 switched by the control signal $\phi$SA2B. The control signals $\phi$SAN, $\phi$SA1B and $\phi$SA2B are output from the timing generator TG.

As described, in the setup where the DRAM of the invention receives the externally supplied voltage VDD (e.g., 3.3 V) through its external power supply terminals, the MOS transistors in the memory arrays MARY0 and MARY1 are made smaller for the sake of enhanced storage capacity. The shortened gate lengths of these MOS transistors render their gate oxidation films thinner so that the operating voltage for the memory arrays MARY0 and MARY1 is reduced. Illustratively, a stepped-down voltage VDL of 2.2 V is used as the basic operating power. Here, supplying the drive line SDP with the stepped-down voltage VDL alone would lower the operating speed of the sense amplifiers 3. Instead, the drive line SDP is fed with the externally supplied voltage VDD at the start of the sense amplifier activation timing and later with the amplifiers in the sense amplifier overdrive scheme.

Figure 2:
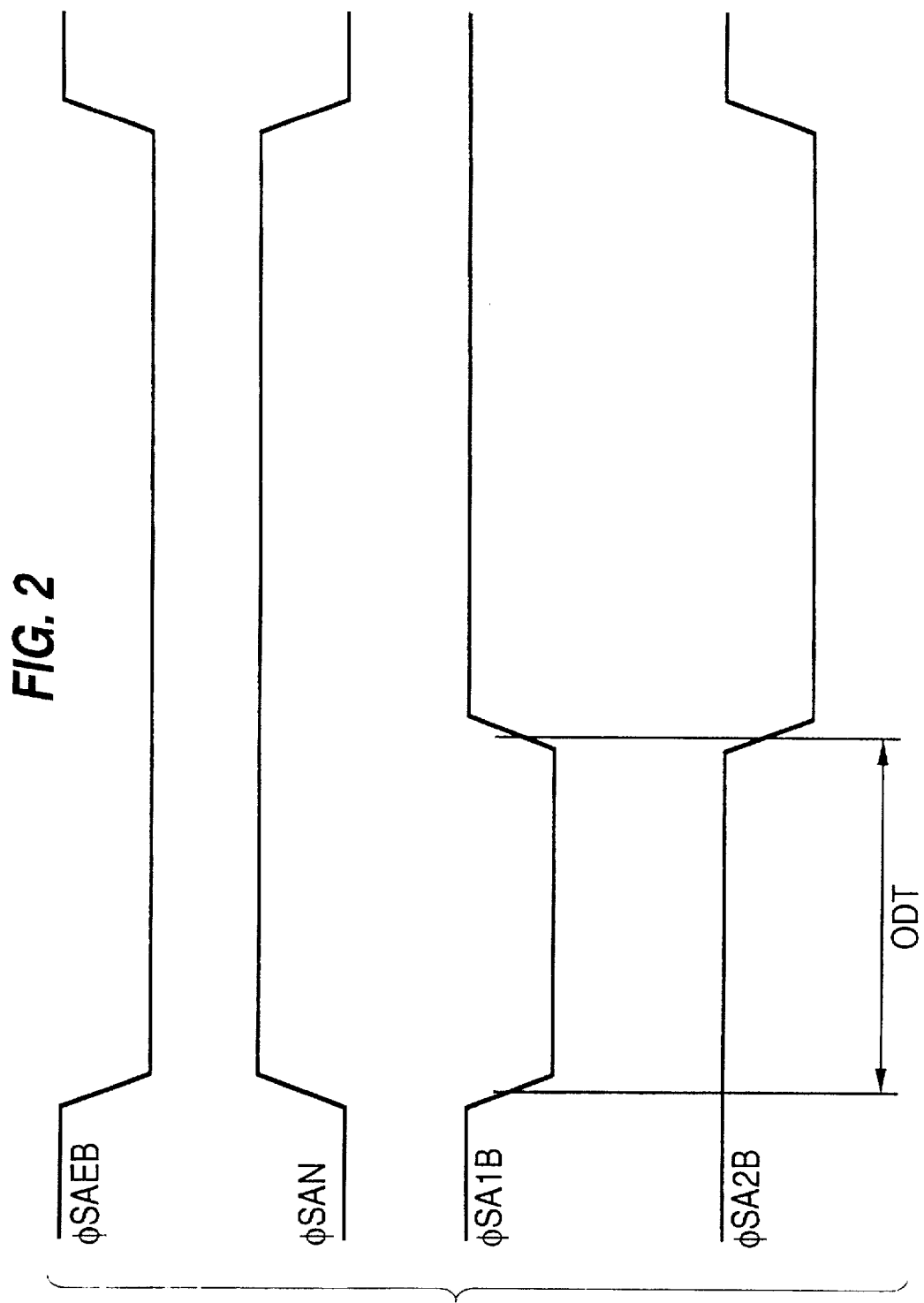
FIG. 2 is a waveform chart showing waveforms of control signals for controlling sense amplifiers in the overdrive setup of the invention.

As shown in FIG. 2, when a control signal $\phi$SAEB (an internal control signal of the timing generator TG, not shown in FIG. 1) that defines the active period of the sense amplifiers 3 is driven to the Low active level, the control signal $\phi$SA1B is first brought Low, causing the supply voltage VDD to be fed to the drive line SDP via the MOS transistor Q41. This rapidly amplifies the small potential difference that appears across the complementary data lines DL0 to DL0B upon memory cell selection operation because the current supplied from the p-channel MOS transistors Q13 and Q14 of the sense amplifiers 3 is relatively large. Then, with the control signal $\phi$SA1B brought High and with the control signal $\phi$SA2B driven Low, the stepped-down voltage VDL is supplied to the driven line SDP via the MOS transistor Q42. The control signal $\phi$SAN is driven High in synchronism with the control signal $\phi$SAEB being Low. The process above sets the level, reached by one of the complementary data lines driven by the sense amplifiers 3, at the ground potential VSS; the level reached by the other complementary data line is set at the stepped-down voltage VDL. The amplifying operation of the sense amplifiers 3 driven on the low voltage of the memory arrays is enhanced in speed in this manner. In FIG. 2, reference characters ODT denote overdrive time.

The step-down circuit 1 in FIG. 1 has an output terminal Nout at the point of serial connection between a p-channel MOS transistor Q50 coupled to the externally supplied voltage VDD, and a high resistance R1 coupled to the ground potential VSS. The output of the output terminal Nout is fed back to the non-inverted input terminal (+) of an operation amplifier AMP, another component of the step-down circuit 1. The inverted input terminal (−) of the operation amplifier AMP is supplied with a reference voltage VLR. Structured in this manner, the operation amplifier AMP controls the switching of the MOS transistor Q50. When the potential of the output terminal Nout is lower than the reference voltage VLR, the operation amplifier AMP under its negative feedback scheme increases the conductance of the MOS transistor Q50 (i.e., lowers the ON-state resistance); when the potential of the output terminal Nout is higher than the reference voltage VLR, the operation amplifier AMP reduces the conductance of the MOS transistor Q50 (i.e., increases the ON-state resistance), whereby the voltage of the output terminal Nout is kept at the reference voltage VLR. The voltage thus formed at the output terminal Nout is the stepped-down voltage VDL. The value of the resistance R1 is made particularly high in order to minimize any feedthrough current that may flow through the MOS transistor Q50, the resistance R1 and the series circuit. Under negative feedback control of the above kind, the current flowing to the output terminal Nout via the high resistance R1 is practically negligible. The reference voltage VLR is a control voltage generated illustratively by a known reference voltage generator, not shown, generating the voltage of, say, 2.2V.

While the externally supplied voltage VDD in the above example is 3.3V, there usually is provided a tolerable range of about ±10% for any available supply voltage. That is, even when the lowest voltage VDD within the tolerable range is supplied externally, the transient response operation of the sense amplifiers 3 must be kept rapid enough by setting an appropriate active period (i.e., overdrive time ODT) for the control signal φSA1B. However, if the overdrive time is fixed from such a standpoint alone, a reverse current flow can occur from the drive line SDP to the output terminal Nout of the step-down circuit 1 at the time the operating power of the sense amplifiers 3 is switched from the externally supplied voltage VDD to the stepped-down voltage VDL. The reverse current flow in the above case may take place if the externally supplied voltage VDD is beyond the upper tolerable limit or if a particularly high external voltage VDD is supplied for such purposes as operation margin tests on the part of the supply voltage VDD. The reverse current that flows is not expected to be discharged immediately to the ground potential VSS via the high resistance R1. The reverse current from the drive line SDP gradually raises the level of the stepped-down voltage VDL and increases the pre-charge level (VDL/2) of the complementary data lines correspondingly.

This embodiment of the invention prevents the above kind of excess overdrive that can cause the reverse current flow from the drive line SDP to the step-down circuit 1. This is achieved by variably controlling the overdrive time ODT in keeping with the level of the supply voltage VDD.

A timing generator to control the overdrive time ODT in that manner is shown in FIG. 1 as part of the timing generator TG. While the control signal φSAEB defining the active period of the sense amplifiers 3 is being Low, the control signal φSA1B is activated first, followed by the control signal φSA1B being activated in a complementarily changing manner. This is accomplished by use of a NAND gate 10 and a NOR gate 11 each of which is of a two-input type. A first input terminal of the NAND gate 10 and a first input terminal of the NOR gate 11 are interconnected between the first input terminal of the NAND gate 10 and its second input terminal is a delay circuit 12 having an odd number of CMOS inverters INV0 through INVi (i=2n−1) connected in series. The second input terminal of the NAND gate is supplied with the control signal φSAEB via a CMOS inverter 13. A second input terminal of the nOR gate 11 is fed with the control signal φSAEB. The control signal φSA1B is output from the NAND gate 10, and the control signal φSA2B is formed by a CMOS inverter 14 inverting the output of the NOR gate 11. The control signal φSAN is generated by passing the control signal φSAEB through three CMOS inverters 15, 16 and 17 connected in series.

The operating power sources to power the circuitry within the timing generator TG are the externally supplied voltage VDD and the ground potential VSS. The number of serially connected CMOS inverters INV0 through INVi included in the delay circuit 12 is determined so that there will be a sufficient overdrive time ODT to expedite the transient response operation of the sense amplifiers 3 even if the externally supplied voltage VDD is at its lowest tolerable level. When the externally supplied voltage VDD is low, the overdrive time ODT is relatively prolonged; when the voltage VDD is high, the overdrive time ODT is relatively shortened. This is because the higher the operating voltage for the CMOS inverters INV0 to INVi of the delay circuit 12 defining the overdrive time ODT, the shorter the transient response time. With the delay circuit 12 negatively dependent for its delay time on the externally supplied voltage VDD, the delay time is relatively shortened when the voltage VDD is at its highest tolerable level or when a particularly high voltage VDD is supplied externally for purposes such as operation margin tests on the part of the supply voltage VDD. In other words, when VDD is at a high level, the overdrive time ODT is made relatively short, and the time in which the relatively high externally supplied voltage VDD is fed to the drive line SDP via the MOS transistor Q41 is shortened. This makes it possible to prevent the sense amplifiers 3 from being excessively overdriven by the externally supplied voltage VDD which has a relatively high level.

With the sense amplifiers 3 kept from being excessively overdrive, reverse current flows from the numerous sense amplifiers 3 to the step-down circuit 1 are forestalled, which prevents the stepped-down voltage VDL from rising inadvertently. This provides protection against the case where the reliability of the circuits operating on the reduced voltage would be degraded by an inadvertent rise in the stepped-down voltage VDL. For example, as one disadvantage of the prior art, there is a case where the voltage level to be reached by the data lines during an amplifying operation of the sense amplifiers 3 is raised by an increase in the stepped-down voltage VDL, which reduces the potential difference between the word line selection level and the high level of the data lines. In that case, a high-level write to a memory cell cannot be achieved because the high-level voltage of the applicable data line is incapable of being applied to the storage capacity and SC. This sort of problem is now solved by the present invention.

As another disadvantage of the prior art, an undesirable rise in the stepped-down voltage VDL pushes up the voltage level to be reached by the data lines upon operation of the sense amplifiers 3. This raises the pre-charge level, i.e., the initial level of the data lines that are equalized while the chip is not being selected. When data is written and read out in such a state, the high-level read voltage margin is made small with respect to the pre-charge level. This sort of difficulty is also resolved by the invention. Furthermore, where the step-up circuit 2 for generating the word line selection level VPP utilizes the stepped-down voltage VDL, there used to be the possibility that an unwanted rise in the stepped-down voltage VDL can boost the word line selection level CPP, thereby damaging the gate oxidation film of the selector MOS transistor Q1 of the memory cell MC in question. This disadvantage of the prior art is also now overcome by the invention.

Figure 6:
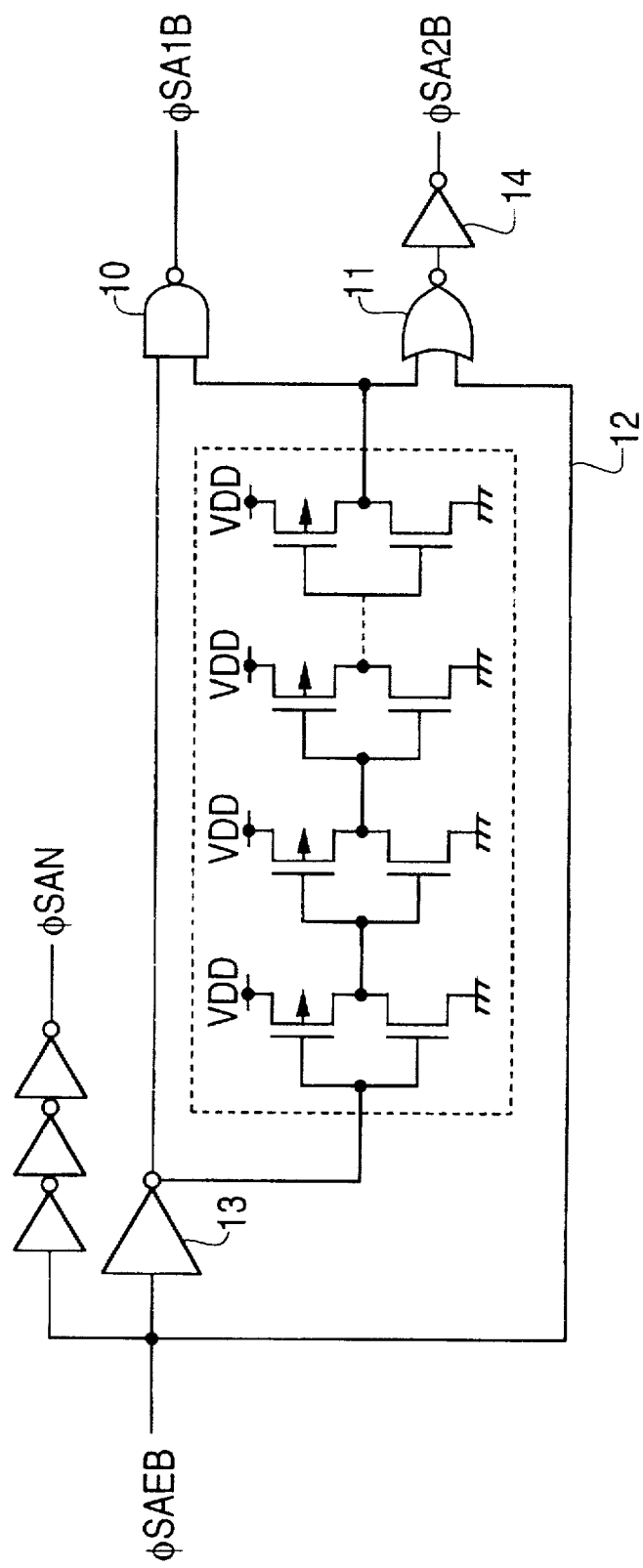
FIG. 6 is a schematic circuit diagram particularly showing the delay circuit 12 of FIG. 1 in greater detail.

FIG. 6 shows, in schematic form, an arrangement for constructing the delay circuit 12 such that the amount of delay will be dependent on the supplied $V_{DD}$ level. Specifically, as shown in FIG. 6, each of the inventors INV0-INVi of FIG. 1 is constructed of a CMOS pair of MOS transistors having their source-drain paths in series between the supply voltage VDD and ground. As such, the amount of delay in each inverter stage will be directly dependent on the relative level of the voltage $V_{DD}$ since a high level of $V_{DD}$ will cause the inverters to respond quickly (thereby reducing the overall delay) whereas a low level of $V_{DD}$ will cause the inverters to respond slowly (thereby increasing delay). To put this another way, the time interval ODT during which the high voltage $V_{DD}$ is applied to the sense amplifier line SDP will be negatively dependent on the $V_{DD}$ level due to the operation of the inverters of the delay circuit 12. Specifically, a high $V_{DD}$ level will reduce the delay, thereby reducing the time period ODT. Therefore, the high level of $V_{DD}$ will be applied to the line SDP only for a short time. On the other hand, if the level of $V_{DD}$ is relatively low, the delay will increase, thereby expanding the time period ODT during which the voltage $V_{DD}$ is applied to the line SDP. This negative dependence of the time period ODT on the relative level of $V_{DD}$ is an important point of distinction over prior art devices such as that shown in JP-A-5-62467 which have no such relationship between the supply voltage and the overdrive time period.

Figure 3:
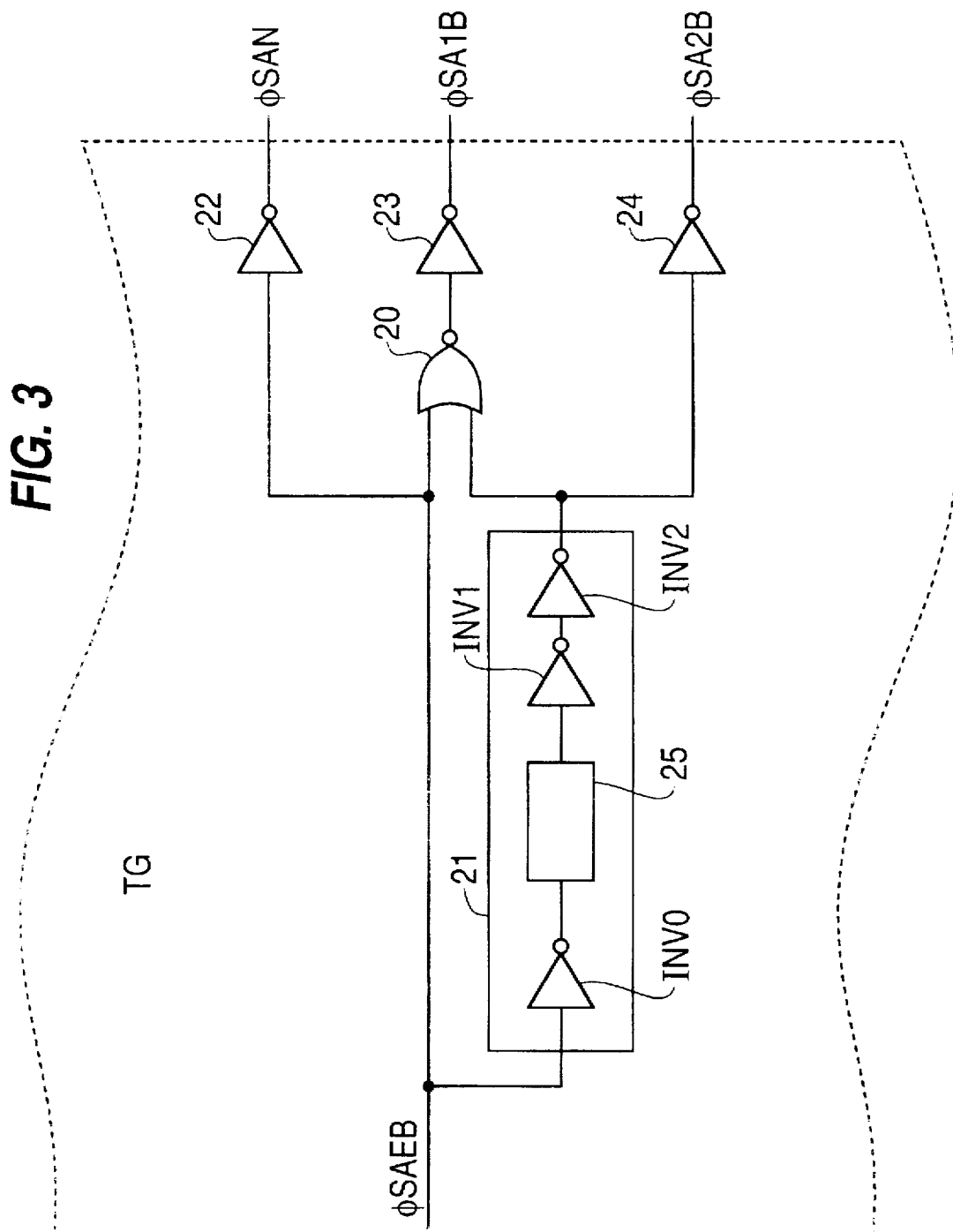
FIG. 3 is a logic circuit diagram of another generating logic of control signals for controlling sense amplifiers in the overdrive setup of the invention.

FIG. 3 is a logic circuit diagram of another circuit arrangement for generating the control signals φSAN, φSA1B and φSA2B for controlling sense amplifiers in accordance with the present invention. The circuit shown in FIG. 3 comprises a two-input NOR gate 20. One input terminal of the NOR gate 20 is supplied with the control signal φSAEB. Between that input terminal and the other input terminal of the NOR gate 20 is a delay circuit 21 for determining overdrive time. The control signal φSAN is formed by a CMOS inverter 22 inverting the control signal φSAEB. The control signal φSA1B is generated by a CMOS inverter 23 inverting the output of the NOR gate 20. The control signal φSA2B is produced by a CMOS inverter 24 inverting the output of the delay circuit 21. The illustrated logic constitution also serves basically to generate the control signals φSAN, (SA1B and PSA2B whose waveforms are depicted in FIG. 2. Of particular interest in the setup of FIG. 3 is that the delay circuit 21 is constituted by an odd number of CMOS inverters INV0, INV1, INV2 and a CR delay circuit 25 connected in series. The CR delay circuit 25 is a delay element composed of a passive circuit element such as a capacitor and/or a resistor. Unlike CMOS inverters, the CR delay circuit 25 has no negative dependence for its delay time on the supply voltage. In cases where the delay circuit 12 of FIG. 1 composed of only CMOS inverters is found to be excessively dependent for its delay time on the supply voltage, that delay circuit structure will be advantageously replaced by the setup of FIG. 3 wherein the delay circuit is formed by CMOS inverters combined with a CR delay circuit with no dependence for its delay time on the supply voltage. Obviously, the delay circuit 21 of FIG. 3 may also be adopted by the logic constitution of FIG. 1.

Major benefits of the invention disclosed herein are summarized as follows:

With the overdrive technique adopted as the method for driving differential amplifiers such as sense amplifiers, the externally supplied voltage may become in excess of its highest tolerable level or may be made particularly higher than usual for operation margin tests on the supply voltage side. In such a case, the delaying means that defines overdrive time is arranged to be negatively dependent for its delay time on the externally supplied voltage. This relatively shortens the delay time of the delaying means. In other words, when the supply voltage is particularly high, the overdrive time (ODT) is made relatively short, and the time during which the relatively high externally supplied voltage (VDD) is fed to the drive line (SDP) is shortened. This makes it possible to prevent the differential amplifiers from becoming excessively overdrive by the externally supplied voltage which has a relatively high level.

With the differential amplifier circuitry thus protected from excess overdrive, it is possible to prevent the reverse current flow from the numerous differential amplifiers toward the step-down circuit. This in turn prevents the stepped-down voltage (VDL), to be supplied to those memory arrays of the DRAM which run on the reduced operating voltage, from becoming inadvertently raised. This provides protection against the case where the reliability of the circuits operating on the reduced voltage would be degraded by an inadvertent rise in the stepped-down voltage. One typical disadvantage of the prior art is the case where the voltage level to be reached by the data lines during an amplifying operation of the differential amplifiers such as sense amplifiers is raised by an increase in the stepped-down voltage, which reduces the potential difference between the word line selection level and the high level of the data lines. In that case, a high-level write to a memory cell cannot be achieved conventionally since the high-level voltage of the applicable data line is incapable of being applied to the storage capacity and this deficiency is now removed by the invention.

Another disadvantage of the prior art is the case in which an undesirable rise in the stepped-down voltage pushes up the voltage level to be reached by the data lines upon operation of differential amplifiers such as sense amplifiers. This raises the pre-charge level of the data lines that are equalized. When data is conventionally written and read out in such a state, the high-level read voltage margin is made small with respect to the pre-charge level. This deficiency is also resolved by the present invention.

A further disadvantage of the prior art is that where the step-up circuit for generating the word line selection level utilizes the stepped-down voltage, there is the possibility that an unwanted rise in the stepped-down voltage can boost the word line selection level. This can damage the gate oxidation film of the memory selecting transistors. This deficiency is also now overcome by the invention.

In the above-described embodiment of FIG. 3, the delaying means is composed of a passive element such as a CR delay circuit (with no dependence for its delay time on the supply voltage) in combination with the MOS transistor circuit. This circuit arrangement is an advantageous alternative to the case where securing the necessary delay time with only the MOS transistor circuit (illustratively made up of CMOS inverters) turns out to involve too much dependence for the delay time on the supply voltage. An optimum balance may then be acquired between the necessary delay time and the required dependence on the supply voltage for determining that delay time.

Although the description above contains man y specificities, the se should not be construed as limiting the scope of the invention but as merely providing illustrations of the presently preferred embodiment of this invention. Many apparently different embodiments of this invention may be made without departing from the spirit and scope thereof. For example, the power source arrangement of the step-down circuit 1 is not limited to the illustrated negative feedback scheme involving the operation amplifier. The embodiment described above is not limitative of the invention particularly in terms of memory mat constitution of the DRAM, logical structure for memory ma t selection and parallel I/O bit count of data. The logical structure of the circuit that generates the control signals φSAN, φSA1B and φSA2B for sense amplifier control is not limited to the setups of FIGS. 1 and 3. MOS circuits as delaying means are not limited to CMOS inverters but may be constituted by such logic gates as NAND and NOR gates. Also, the circuit with negative dependence for its delay time on the supply voltage is not limited to one which consists of MOS transistors alone. Such a circuit may include other circuit elements such as bipolar transistors.

Although the foregoing description has dealt primarily with the field of DRAMs constituting the technical background of the present invention, the invention is not limited to this kind of DRAM. The present invention may be applied extensively to semiconductor integrated circuits having differential amplifiers for receiver purposes in data transmission. Such applications will include synchronous DRAMs operating in synchronism with a clock signal, pseudo-static RAMs, and memories mounted on the chip of data processing LSIs such as microcomputers.

The invention may be embodied in other specific forms without departing from the spirit or essential characteristic thereof. The present embodiments are therefore to be considered in all respects as illustrative and not restrictive.

We claim:

1. A semiconductor integrated circuit comprising:

a differential amplifier which has a power input terminal and a pair of signal input terminals, and amplifies a potential difference on complementary signal lines connected to said pair of signal input terminals; and a control circuit which generates a first driving control signal for controlling the supplying to said power input terminal with a first driving voltage as an operating power supply therefor, said control circuit further generating a second driving control signal for controlling the supplying to said power input terminal with a second driving voltage, as another power supply of said differential amplifier, which is activated after the activated first driving control signal is deactivated and which is lower in level than said first driving voltage;

wherein said control circuit includes a delay circuit defining a time interval from the time said first driving control signal is activated until said second driving control signal is activated, and wherein said delay circuit includes an inverter receiving said first driving voltage as a power source so that said time interval has a negative dependence on said first driving voltage.

2. A semiconductor integrated circuit according to claim 1, wherein said inverter is a CMOS inverter circuit.

3. A semiconductor integrated circuit comprising:

a plurality of memory cells with selection terminals connected to word lines;

complementary signal lines connected to data input/output terminals of said memory cells;

a differential amplifier which has a power input terminal and a pair of signal input terminals, and amplifies a potential difference on said complementary signal lines connected to said pair of signal input terminals;

a step-down circuit which lowers an externally supplied voltage so as to generate a stepped-down voltage lower than the selection level of said word lines; and a control circuit which generates a first driving control signal for controlling the supplying to said power input terminal with said externally supplied voltage as an operating power supply therefor during a portion of time that said differential amplifier is activated, said control circuit further generating a second driving control signal for controlling the supplying to said power input terminal with said stepped-down voltages, generated by said step-down circuits as another operating power supply for said differential amplifier after the activated first driving control signal is deactivated;

wherein said control circuit includes a delay circuit defining a time interval from the time said first driving control signal is activated until said second driving control signal is activated, and wherein said delay circuit includes an inverter receiving said externally supplied voltage as a power source so that said time interval has a negative dependence on said externally supplied voltage.

4. A semiconductor integrated circuit according to claim 3, wherein said step-down circuit has an output, at which said stepped-down voltage is generated, located at a point of serial connection between a current source and a high resistance.

5. A semiconductor integrated circuit according to claim 4, wherein said memory cells are dynamic memory cells, and further comprising a circuit for generating as a pre-charge voltage of said complementary signal lines a voltage approximately half the voltage on the output terminal of said step-down circuit, an equalizing circuit for selectively connecting said complementary signal lines, and a pre-charge circuit for supplying said complementary signal lines with said pre-charge voltage at a time that said complementary signal lines are connected by said equalizing circuit.

6. A semiconductor integrated circuit according to claim 3, wherein the period of time of application of said first driving control voltage followed by the application of said second driving control voltage together constitute the activation period of said differential amplifier.

7. A semiconductor integrated circuit according to claim 6, wherein said stepped-down voltage is supplied to said power input terminal for a relatively greater portion of said activation period than that of said externally supplied voltage.

8. A semiconductor memory comprising:

a pair of data lines;

a sense amplifier including a pair of P-channel MOSFETs and a pair of N-channel MOSFETs, wherein each of said pairs of P-channel and N-channel MOSFETs have sources coupled in common, drains coupled to said pair of data lines, respectively, and gates cross-coupled to said drains, respectively;

a first terminal for receiving a first voltage;

a second terminal for receiving a second voltage which is lower than said first voltage;

a first switch MOSFET coupled between said first terminal and said sources of said pair of P-channel MOSFETs;

a second switch MOSFET coupled between said second terminal and said sources of said pair of P-channel MOSFETs; and a control circuit outputting signals supplied to the gates of said first and second switch MOSFETs so that, in a first period, said first switch MOSFET is in an ON state and, in a second periods after said first period, said first switch MOSFET is in an OFF state and said second switch MOSFET is in an ON state, wherein said control circuit comprises a delay circuit defining said first period, and wherein said delay circuit includes an inverter receiving said first voltage as a power source so that said first period has a negative dependence on said first voltage.

9. A semiconductor memory according to claim 8, wherein said inverter is a CMOS inverter.

10. A semiconductor memory according to claim 8, wherein said control circuit controls said second switch MOSFET to be in an OFF state in said first period.

11. A semiconductor memory according to claim 8, wherein said second period, corresponding to the ON state of said second switch MOSFET, is longer than said first period, corresponding to the ON state of said first switch MOSFET.

12. A semiconductor memory according to claim 11, further comprising dynamic memory cells connected to said pair of data lines.

13. A semiconductor memory according to claim 12, wherein said pair of data lines are complementary data lines.

14. A semiconductor memory according to claim 1, wherein said delay circuit includes a plurality of said inverters connected in series with one another.

15. A semiconductor memory according to claim 14, wherein said delay circuit includes a passive delay element, with a delay which is not dependent on said first driving voltage, coupled between a pair of said series connected inverters.

16. A semiconductor memory according to claim 3, wherein said delay circuit includes a plurality of said inverters connected in series with one another.

17. A semiconductor integrated circuit according to claim 16, wherein said delay circuit includes a passive delay element, with a delay which is not dependent on said externally supplied voltage, coupled between a pair of said series connected inverters.

18. A semiconductor integrated circuit according to claim 8, wherein said delay circuit includes a plurality of said inverters connected in series with one another.

19. A semiconductor integrated circuit according to claim 18, wherein said delay circuit includes a passive delay element, with a delay which is not dependent on said first voltage, coupled between a pair of said series connected inverters.

20. A semiconductor memory according to claim 8, further comprising dynamic memory cells connected to said pair of data lines.

21. A semiconductor memory according to claim 20, wherein said first period and said second period together constitute the activation period of said sense amplifier.

22. A semiconductor memory according to claim 21, wherein said second period is longer than said first period.

23. A semiconductor memory according to claim 22, further comprising dynamic memory cells connected to said pair of data lines.

24. A semiconductor memory according to claim 23, wherein said pair of data lines are complementary data lines.

* * * * *